United States Patent

Schoon

[11] 3,934,136
[45] Jan. 20, 1976

[54] THRESHOLD SIGNAL CIRCUITRY FOR SCANNING APPARATUS

[75] Inventor: David J. Schoon, Marine on St. Croix, Minn.

[73] Assignee: Minnesota Mining and Manufacturing Company, St. Paul, Minn.

[22] Filed: May 6, 1974

[21] Appl. No.: 466,976

[52] U.S. Cl. .............................. 250/214 R; 250/563
[51] Int. Cl.[2] ........................................ H01J 39/12
[58] Field of Search .......... 250/206, 214, 208, 209, 250/563, 572, 226, 214 RC

[56] References Cited
UNITED STATES PATENTS

| | | | |
|---|---|---|---|
| 3,465,169 | 9/1969 | Foerster | 250/214 |
| 3,560,757 | 2/1971 | Pugsley | 250/226 |
| 3,809,892 | 5/1974 | Schober | 250/226 |
| 3,835,247 | 9/1974 | Soames | 250/563 |

Primary Examiner—James W. Lawrence
Assistant Examiner—D. C. Nelms
Attorney, Agent, or Firm—Alexander, Sell, Steidt & DeLaHunt

[57] ABSTRACT

Circuitry providing a scanning threshold for a scanning apparatus in response to the output of a photomultiplier of the apparatus produced during a threshold determining scan of the field uses a first memory circuit to store a signal level indicative of the maximum light intensity sensed by the photomultiplier with a second memory circuit provided to store a signal level indicative of the minimum light intensity sensed. A threshold circuit connects with the stored signals to provide a threshold signal intermediate the two stored signal levels. An inhibiting circuit may be provided to prevent the second memory circuit from responding to signals below a predetermined level. Inhibiting circuitry and memory deletion circuitry are used to condition the memories prior to and immediately following a threshold determining scan.

7 Claims, 2 Drawing Figures

3,934,136

THRESHOLD SIGNAL CIRCUITRY FOR SCANNING APPARATUS

BACKGROUND OF THE INVENTION

This invention relates to threshold signal determining circuits for use in scanning instruments.

Various scanning instruments are available for scanning a field which varies in opacity or reflectivity. Such instruments generally employ a light to electric transducer, which presents an output in accordance with the light received from the field as it is scanned. A photomultiplier amplifier, a vidicon tube or image dissector tube are examples of light to electric transducers used in scanning instruments. The output from the light to electric transducer is generally related to some threshold signal level when the instrument is required to provide an output involving an interpretation of the scan. For example, when the output from the light to electric transducer exceeds an established threshold signal level such output may indicate that the portion of the field giving rise to such output contains a condition being sought while any lesser output indicates the field portion then being scanned does not contain the condition being sought or visa versa.

Some instruments require manual adjustment of the threshold level by the operator with the results obtained checked against an operator count or operator measurement of the condition being examined.

It is desirable that any threshold level signal for a scanning instrument be established as quickly and accurately as possible without requiring any judgment or apparatus adjustment by the operator and that it be made for each field to be examined. In addition, it is desirable that the threshold level signal be established immediately prior to an operative scan of the field.

There are applications for scanning instruments which require the scan of the field presented on a petri plate on which paper discs are located. It is desirable that a threshold signal determining circuit for an instrument used for such purpose be arranged so that the threshold level signal will not be determined in any way by the output of the light to electric transducer produced when such paper discs are scanned.

SUMMARY OF THE INVENTION

The invention disclosed herein is embodied in a circuit for providing a scanning threshold signal or signals for a scanning apparatus in response to the output of the light to electric transducer of the apparatus produced during a threshold signal determining scan of a field wherein the circuit comprises a first memory circuit portion connected to the output of the light to electric transducer for storing a signal proportional to the maximum light intensity received by the light to electric transducer during the threshold signal determining scan; a second memory circuit portion connected to the output of the light to electric transducer for storing a signal proportional to the minimum light intensity received by the light to electric transducer during the threshold determining scan; and a threshold level circuit portion connected for responding to said signal stored by the first memory circuit portion and the signal stored by the second memory circuit portion for providing a threshold level signal that is less than said signal stored by the first memory circuit portion and greater than the signal stored by the second memory circuit portion.

The invention presented herein also provides for an inhibiting circuit portion connected to the second memory circuit portion when it is desired that the second memory circuit portion be prevented from responding to the output from the light to electric transducer when said output is less than a predetermined portion of the signal stored by the first memory circuit portion. This inhibiting circuit portion is useful where fields to be scanned may be of the type mentioned wherein discs or the like are present, and it is desired that the output of the light to electric transducer due to the discs be disregarded when establishing the scanning threshold signal. In this case, the inhibiting circuit portion can provide an output indicative of the presence of a disc which can be used in an analysis of the scan made of the field.

In addition, the goal of eliminating operator functions is furthered by the inclusion of an inhibiting circuit portion connected to said first and second memory circuit portions for preventing said first and second memory circuit portions from responding to the output of the light to electric transducer after completion of the threshold signal determining scan of the field.

Automatic operation of the circuit is enhanced still further by providing a memory deletion circuit portion connected to said first and second memory circuit portions for deleting the signals stored by said first and second memory circuit portions in response to a start signal initiating the start of the threshold signal determining scan of the field.

BRIEF DESCRIPTION OF THE DRAWINGS

The invention will be understood and its various advantages will become apparent from the description to follow given in conjunction with the accompanying drawing wherein like numerals refer to like elements and wherein.

DESCRIPTION

Figure 1:
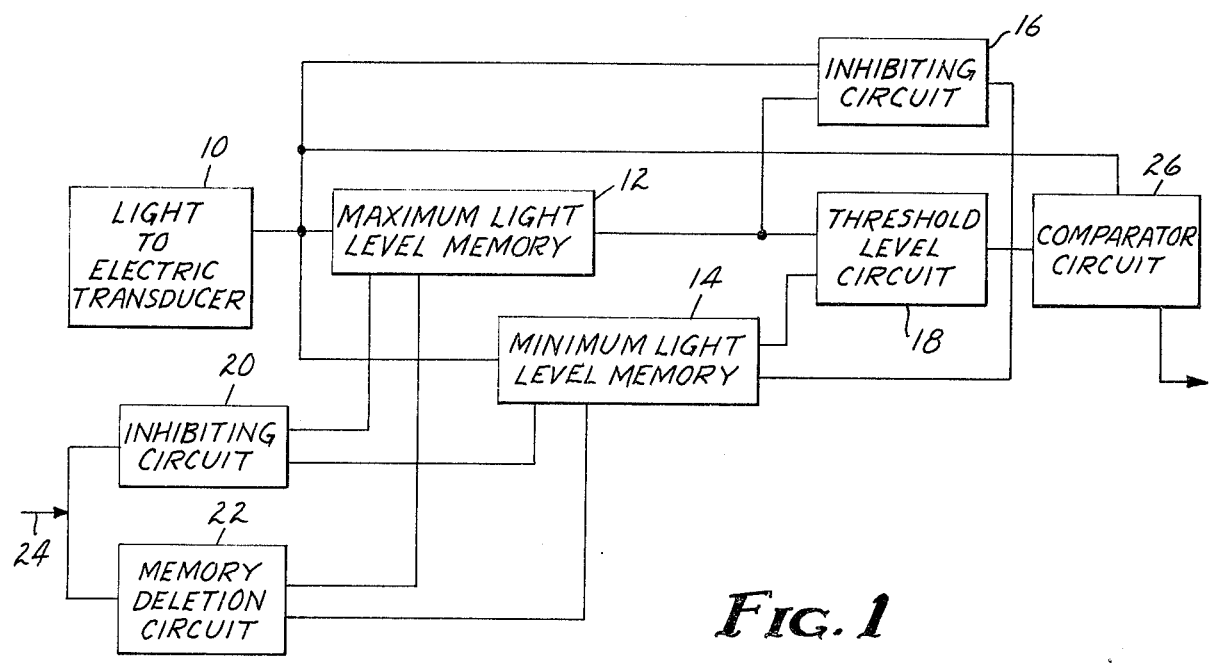
FIG. 1 is a block diagram of the circuitry embodying the invention.

FIG. 1 shows in block diagram form the various circuit portions providing the threshold signal determining circuit embodying this invention. The light to electric transducer 10 is a part of a scanning apparatus (not shown) and provides an output signal that is determined by the light intensity received from a field as it is scanned by the scanning apparatus. Any scanned pattern that will provide good coverage of the field can be used when determining a threshold signal using a circuit of this invention. The output of the transducer 10 is applied to a maximum light level memory 12, a minimum light level memory 14, an inhibiting circuit 16 and a comparator circuit 26. The comparator circuit 26 is connected to receive a second input from a threshold level circuit portion 18. In addition, the circuit includes an inhibiting circuit portion 20 and a memory deletion circuit portion 22. Each of the circuit portions 20 and 22 are connected with the circuit portion 12 and circuit portion 14. The inhibiting circuit portion 20 and the memory deletion circuit portion 22 are each controlled by a start signal applied at the start signal input 24. The threshold level circuit portion 18 is connected to the memory circuit portions 12 and 14. Inhibiting circuit portion 16 is connected to the connection between memory circuit 12 and threshold circuit 18. The connection between the inhibiting circuit portion 16 and the memory circuit portion 14 completes the diagram of FIG. 1. The comparator circuit 26 is included in the diagram to illustrate how the threshold signal is used.

The maximum light level memory 12 responds to the output of transducer 10, which varies in proportion to the light intensity received by the transducer 10 during the scan of a field (not shown), to store a signal which is proportional to the maximum light intensity level received by transducer 10. Similarly, the minimum light level memory 14 responds to the output of transducer 10 to store a signal which is proportional to the minimum light intensity level received by transducer 10. The signal stored in memory 12 and memory 14 are applied to the threshold level circuit 18 to provide the comparator 26 with a threshold signal for the scanner that is less than the signal stored in memory 12 and greater than the signal stored in memory 14. The comparator circuit portion 26 also receives the output signal from the transducer 10 which is compared with the threshold level signal received from circuit portion 18 for providing a signal of one polarity when the output of the transducer 10 is in excess of the threshold level signal and providing a signal of the opposite polarity when the output of transducer 10 is less than the threshold level signal.

Once the threshold level signal has been determined in response to a threshold level signal determining scan of the field, it is desirable that the memories 12 and 14 be inhibited not to respond to any further output from transducer 10 which will be produced when an operational scan of the field is made. An operational scan means a scan made of a field for obtaining output data relative to the factors to be considered with respect to the field. Accordingly, inhibiting circuit portion 20 is provided which serves to inhibit the memory circuit portion 12 and 14 from responding to any input from transducer 10 provided after the threshold level signal determining scan is completed. While the inhibiting circuit portion 20 is connected to receive a start signal applied to the input 24, the inhibiting circuit portion 20 is not effective to inhibit the operation of memories 12 and 14 until the threshold signal determining scan has been completed. Since the threshold level signal determined with respect to one field normally will not be valid for another field to be scanned, it is desirable that the signals stored in memories 12 and 14 in response to a threshold signal determining scan for a field be deleted and a threshold signal be determined prior to the scanning of each subsequent field. The deletion function is accomplished by the memory deletion circuit portion 22 which is connected to the memories 12 and 14. The memory deletion circuit portion 22 responds to a start signal applied to the input 24 to delete the signal stored in memories 12 and 14 at the start of a threshold signal determining scan for a field to be examined.

There are applications for a scanning apparatus where the fields to be examined will contain areas of opacity or reflectivity that provide output signals from the transducer 10 which should not be considered when making a threshold signal determining scan of the field. An application of this type may, for example, involve the scanning of petri plates on which an agar medium has been placed with a pathogen and a number of paper discs containing antibiotics located on the agar. Three distinct levels of opacity are obtained with such a plate: the zone areas in which no bacteria grow, these areas being more clear than any other area; the bacteria areas which are slightly opaque, and the discs which are almost totally opaque. Two independent intensity thresholds are desired: a first to distinguish zone areas from bacteria areas, and a second to distinguish bacteria areas from discs. Because the thickness of the agar varies from plate to plate and the extent of growth of bacteria varies from plate to plate, no single set of intensity thresholds can be used for all plates. If the transducer 10 output produced when a disc is scanned were to be used in establishing the threshold signal for use in distinguishing zone areas from bacteria areas, the minimum light level memory 14 would most likely store a signal having a level corresponding to that produced when a disc was scanned. The inhibiting circuit portion 16 is used as a part of the circuitry when scanning involves a problem of the type just described. The circuit portion 16 provides an inhibiting signal to memory 14 whenever the output of transducer 10 is less than a predetermined portion of the signal stored by the memory 12 so the output of memory 14 will not be influenced by signals applied to it from transducer 10 when the inhibiting signal from circuit 16 is present. The inhibiting circuit portion 16 in such case also provides a signal indicative of a disc. As will be explained when discussing the details of portion 16, this requires the second threshold mentioned plus a comparator circuit.

Figure 2:
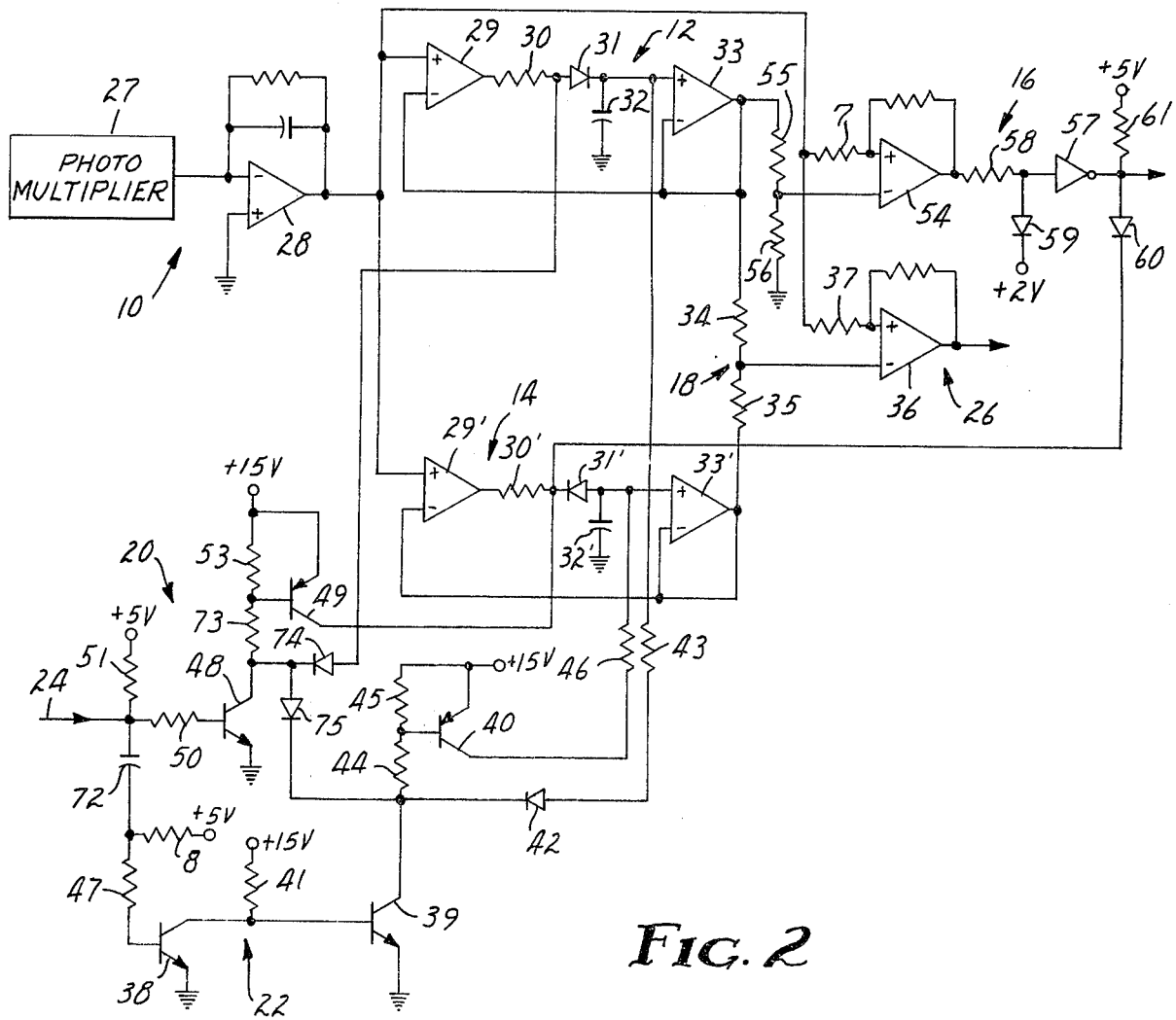
FIG. 2 is a schematic exemplary showing of circuit details for the circuit portions shown in block diagram form in FIG. 1.

FIG. 2 is a schematic exemplary showing of specific circuitry that can be used for the various circuit portions shown in FIG. 1. To simplify the drawing, the various operational amplifiers used are shown without the necessary positive and negative voltage sources shown connected to the amplifiers. For purposes of illustration, the light to electric transducer 10 is shown to include a photomultiplier 27 and an operational amplifier 28. The photomultiplier 27 is connected to the negative (inverting) input of the operational amplifier 28 so an increase in light intensity detected by the photomultiplier 27 will cause its input to the operational amplifier 28 to become more negative causing a positive going signal to be presented at the output of the operational amplifier 28. The maximum light level memory 12 includes an operational amplifier 29 which has its output connected to an integrating circuit for integrating any positive signals presented at the output of the amplifier 29 with an operational amplifier 33 connected to the integrating circuit. The integrating circuit includes the resistor 30, diode 31 and capacitor 32. The side of the capacitor 32 connected to the cathode of diode 31 is connected to the positive input terminal of the operational amplifier 33 while the other side of the capacitor 32 is connected to ground. The output of operational amplifier 33 is connected to its negative input and to the negative input of operational amplifier 29. With such an arrangement, the voltage presented on capacitor 32 will be presented at the output of operational amplifier 33. As will be explained, the voltage present on capacitor 32 prior to the start of a scan for determining the threshold level signal for a field to be scanned is deleted at the beginning of such scan by discharging capacitor 32. The capacitor 32 is then charged in accordance with the maximum signal level received from operational amplifier 29.

The minimum light level memory 14 is identical in structure with the maximum light level memory circuit portion 12 with the exception that the diode in circuit 14 is poled in the opposite direction from diode 31 of circuit 12. The various corresponding components are, therefore, identified in FIG. 2 using the same reference numerals as were used for the components in circuit 12 with the prime mark added to the reference numeral. As will be explained, the voltage present on capacitor 32' prior to the start of a scan for determining the threshold level signal for a field to be scanned is deleted at the beginning of such scan by charging the capacitor 32'. Whenever the output of operational amplifier 29' presents a signal level which is below the voltage on capacitor 32', capacitor 32' discharges to such voltage level. The discharge path for capacitor 32' is via diode 31', resistor 30' and thence to ground via the negative voltage supply (not shown) for the amplifier 29'. Upon completion of the threshold level signal scan, the charge on capacitor 32' will be equal to the lowest output voltage presented at the output of operational amplifier 29'.

Upon completion of the scan for determining the threshold level signal, the output of memory 12 will have a voltage that is proportional to the highest light intensity detected by the photomultiplier 27 during such scan while the output of memory 14 will present a voltage proportional to the lowest light intensity detected by the photomultiplier 27 during such scan. Series connected resistors 34 and 35 are connected between the output of operational amplifiers 33 and 33' to provide the threshold level circuit 18. The threshold level signal is obtained at the connection common to resistors 34 and 35. The threshold level signal will have a value that is the average of the voltage at the output of operational amplifier 33 and the voltage at the output of operational amplifier 33' if like resistors are used for resistors 34 and 35.

The comparator circuit portion 26 includes an operational amplifier 36 which has its negative terminal connected to receive the threshold level signal from circuit 18 and its positive terminal connected to the output of transducer 10 via a resistor 37. The output signal of comparator circuit 26 is positive when the output of the transducer 10 presents a signal that is greater than the threshold level signal and is negative when the output of the transducer 10 is less than the threshold level signal.

The memory deletion circuit portion 22 includes the NPN transistors 38 and 39 and the PNP transistor 40. Transistors 38 and 39 have their emitter electrodes connected to ground with the collector electrode of transistor 38 and the base electrode of transistor 39 connected to a positive voltage (shown as +15 volts) via a resistor 41. The collector electrode of transistor 39 is connected via a diode 42 and resistor 43 to the positive input of the operational amplifier 33 for the maximum light level memory 12. The cathode of diode 42 is connected to the collector electrode of transistor 39. The collector electrode of transistor 39 is also connected to a positive voltage source (shown as +15 volts) via the series connected resistors 44 and 45. The base of transistor 40 is connected to the connection common to resistors 44 and 45, while the emitter electrode is connected to the positive voltage source (shown as +15 volts). The collector electrode of transistor 40 is connected via a resistor 46 to capacitor 32' of the minimum light level memory 14. The input 24 is connected to the base of transistor 38 via a capacitor 72 and a resistor 47. The connection common to capacitor 72 and resistor 47 is connected to a positive voltage source (shown as +5 volts) via a resistor 8.

Since the start signal at input 24 is applied to both the inhibiting circuit 20 and the memory deletion circuit 22 causing the operation of the two circuits to be interrelated, details of the inhibiting circuit portion 20 will be considered before discussing the operation of the memory deletion circuit portion 22. The inhibiting circuit portion 20 includes an NPN transistor 48 and a PNP transistor 49. The base of transistor 48 is connected to a positive voltage source (shown as +5 volts) via series connected resistors 50 and 51. The input 24 is connected to the connection common to resistors 50 and 51. The emitter of transistor 48 is connected to ground while the collector is connected to a positive voltage source (shown as +15 volts) via series connected resistors 73 and 53. The emitter of transistor 49 is connected to the same voltage source, while its base is connected to the connection common to resistors 73 and 53. The collector of transistor 49 is connected directly to the cathode of diode 31' of the minimum level memory circuit portion 14. Diode 74, which has its cathode connected to the collector of transistor 48, has its anode connected to the anode of diode 31 in the maximum light level memory circuit portion 12. The collector of transistor 48 is also connected to the collector of transistor 39 via a diode 75, which has its anode connected to the collector of transistor 48.

The signal present at the input 24 will be referred to as either being high or low for purposes of explaining the operation of the inhibiting circuit portion 20 and the memory deletion circuit portion 22. Input 24 is normally high and upon application of a start signal which initiates the scanning of the field for purposes of establishing the threshold level signal, the signal at input 24 is low. Presence of a low signal at input 24 causes the transistors 48 and 49 of the inhibiting circuit portion 20 to be off. With the signal at input 24 low, the voltage at the base of transistor 38 is reduced for a time due to the discharge of capacitor 46 causing the transistor 38 to be turned off. With transistor 38 turned off, current flows to the base of transistor 39 causing transistor 39 to conduct. The conduction of transistor 39 reduces the voltage at the base of transistor 40 causing transistor 40 to conduct to cause capacitor 32' of the minimum light level memory 14 to be charged to approximately the positive voltage level applied to the emitter of transistor 40. The voltage presented at the output of minimum light level memory 14 representative of the minimum light level that had been detected during the preceding threshold level signal determining scan is thereby effectively deleted being replaced by a higher voltage. The voltage present on capacitor 32 of the maximum light level memory 12 is reduced to a small fraction of a volt since capacitor 32 is discharged via diode 42 and the conducting transistor 39. The voltage present at the output of operational amplifier 33 representative of the maximum light level detected during the preceding threshold level signal determining scan is thereby deleted. It should be noted that when transistor 39 is conducting the output of operational amplifier 29 of the maximum light level memory 12 is shunted to ground via the diodes 74, 75 and transistor 39, so the output of operational amplifier 29 will not interfere with the rapid discharge of capacitor 32 by the memory deletion circuit portion 22.

though the signal at the input of 24 remains low, capacitor 72 is allowed to charge so the base of transistor 38 again becomes sufficiently positive to cause transistor 38 to conduct which in turn causes transistors 39 and 40 to be turned off. With transistors 39 and 40 turned off, the maximum light level memory circuit portion 12 and the minimum light level memory circuit portion 14 respond to the signals received from the transducer 10 during the threshold level signal determining scan. The signal to the input 24 is high when the threshold signal determining scan is completed causing transistors 48 and 49 to conduct. The conduction of transistor 48, which has its collector connected via diode 74 to the output produced by the operational amplifier 29 serves to inhibit the application of the output of operational amplifier 29 to the capacitor 32. Similarly, since the collector of transistor 49 is connected to the cathode of diode 31', conduction of transistor 49 causes the cathode of diode 31' to be sufficiently positive to prevent any further discharge of the capacitor 32'.

The inhibiting circuit portion 16 includes an operational amplifier 54 connected as a comparator circuit which has its negative input connected to a threshold level circuit which includes resistors 55 and 56 connected in series between the output from the operational amplifier 33 of the circuit portion 12 and ground. The negative input of operational amplifier 54 is connected to the connection common to resistors 55 and 56. In one circuit using an inhibiting circuit portion 16, the values for resistors 55 and 56 were chosen so that the voltage threshold signal applied to the negative terminal of operational amplifier 54 would be only approximately 5% of the voltage level available from the maximum light level memory circuit portion 12. The output of the transducer 10 is connected to the positive input for operational amplifier 54 via a resistor 7. When the output of transducer 10 provides a signal which is less than the signal applied to the negative input terminal of operational amplifier 54, a negative signal will appear at the output of operational amplifier 54 and visa versa. In the case of antibiotic discs on agar plates with bacteria present, a disc when scanned will cause a negative signal to appear at the output of operational amplifier 54. The output from operational amplifier 54 is applied to an inverter 57 via a resistor 58 with a diode 59 connected between the input to the inverter 57 and a positive voltage source (shown as +2 volts) to limit the input to the inverter to safe levels. With the input signal to the inverter 57 negative, a positive signal will be produced at its output which is applied to the cathode of diode 31' via diode 60 to inhibit the operation of the minimum light level memory circuit portion 14 from responding to the output of transducer 10 applied to the circuit portion 14 at that time. Until the output of the inverter goes positive, the output of the inverter 57 is at ground. Accordingly, a signal from transducer 10 which is less than the signal applied to the negative input terminal of operational amplifier 54 will not affect the voltage stored on capacitor 32' of the minimum light level memory 14.

The output of the inverter is shown connected to a positive voltage (shown as +5v) via a resistor 61. The 5 volts available via resistor 61 assures that a full 5 volts will be presented as an inhibiting signal when the output of inverter 57 does go positive.

For use in the case of antibiotic discs on agar plates with bacteria present, the operation of the circuitry which includes the inhibiting circuit portion 16 can be summarized as follows. Amplifier 33 presents an output that is a measure of the greatest intensity detected during the threshold determining scan. Zones present a high intensity. Amplifier 33' presents an output that is a measure of the least intensity detected during the threshold determining scan, exclusive of discs scanned. The most opaque bacteria areas provide this measure of intensity. The junction of resistors 34 and 35 provide an intensity threshold signal indicative of the dividing point between zones and bacteria. The junction of resistors 55 and 56 provides an intensity threshold signal indicative of the dividing point between bacteria and discs. With such threshold signals provided and an operational scan of the field made, the output of operational amplifier 54 is negative when a disc is seen, while the output of operational amplifier 36 is positive when a zone is seen. In addition, when bacteria are seen during an operational scan, the output of operational amplifier 36 is negative and the output of operational amplifier 54 is positive.

This circuitry, when using the inhibiting circuit portion 16, can be applied to other applications where three general opacity levels are observed, and it is desired to automatically generate binary signals indicative of which of the three classes is being sensed.

In the light of the above teachings, alternative arrangements and techniques embodying the invention will be suggested to those skilled in the art. The scope of protection afforded the invention is not intended to be limited to the specific embodiments disclosed, but is to be determined only in accordance with the appended claims.

What is claimed is:

1. A circuit for providing a scanning threshold signal for a scanning apparatus having a light to electric transducer, said signal determined in response to the output of said transducer produced during a threshold signal determining scan of a field comprising:
   a first memory circuit portion connected to the output of the light to electric transducer for storing a signal indicative of the maximum output of the light to electric transducer during the threshold signal determining scan;
   a second memory circuit portion connected to the output of the light to electric transducer for storing a signal indicative of the minimum output of the light to electric transducer during the threshold determining scan;
   inhibiting circuit portion connected to said transducer, said first memory circuit portion and said second memory circuit portion for preventing said second memory circuit portion from responding to the output from the light to electric transducer that is less than a predetermined portion of the signal stored by said first memory circuit portion; and
   a threshold level circuit portion connected for receiving said signal stored by said first memory circuit portion and said signal stored by said second memory circuit portion for providing a threshold level signal that is less than said signal stored by said first memory circuit portion and greater than said signal stored by said second memory circuit portion.

2. A circuit in accordance with claim 1 further comprising an inhibiting circuit portion connected to said first and second memory circuit portions for preventing said first and second memory circuit portions from responding to the output of the light to electric transducer upon completion of the threshold signal determining scan of the field.

3. A circuit in accordance with claim 1 further comprising a memory deletion circuit portion connected to said first and second memory circuit portions for deleting the signals provided by said first and second memory circuit portions at the start of the threshold signal determining scan of the field.

4. A circuit in accordance with claim 1 further comprising an inhibiting circuit portion connected to said first and second memory circuit portions for preventing said first and second memory circuit portions from responding to the output of the light to electric transducer upon completion of the threshold signal determining scan of the field and a memory deletion circuit portion connected to said first and second memory circuit portions for deleting the signals stored by said first and second memory circuit portions at the start of the threshold signal determining scan of the field.

5. A circuit for providing a scanning threshold signal for a scanning apparatus having a light to electric transducer, said signal determined in response to the output of said transducer produced during a threshold signal determining scan of a field comprising:
   a first memory circuit portion connected to the output of the light to electric transducer for storing a signal indicative of the maximum output of the light to electric transducer during the threshold signal determining scan;
   a second memory circuit portion connected to the output of the light to electric transducer for storing a signal indicative of the minimum output of the light to electric transducer during the threshold determining scan;
   a inhibiting circuit portion connected to said first and second memory circuit portions for preventing said first and second memory circuit portions from responding to the output of the light to electric transducer upon completion of the threshold signal determining scan of the field; and
   a threshold level circuit portion connected for receiving said signal stored by said first memory circuit portion and said signal stored by said second memory circuit portion for providing a threshold level signal that is less than said signal stored by said first memory circuit portion and greater than said signal stored by said second memory circuit portion.

6. A circuit for providing a scanning threshold signal for a scanning apparatus having a light to electric transducer, said signal determined in response to the output of said transducer produced during a threshold signal determining scan of a field comprising:
   a first memory circuit portion connected to the output of the light to electric transducer for storing a signal indicative of the maximum output of the light to electric transducer during the threshold signal determining scan;
   a second memory circuit portion connected to the output of the light to electric transducer for storing a signal indicative of the minimum output of the light to electric transducer during the threshold determining scan;
   a memory deletion circuit portion connected to said first and second memory circuit portions for deleting the signals stored by said first and second memory circuit portions at the start of the threshold signal determining scan of the field; and
   a threshold level circuit portion connected for receiving said signal stored by said first memory circuit portion and said signal stored by said second memory circuit portion for providing a threshold level signal that is less than said signal stored by said first memory circuit portion and greater than said signal stored by said second memory circuit portion.

7. The circuit in accordance with claim 6 further comprising an inhibiting circuit portion connected to said first and second memory circuit portions for preventing said first and second memory circuit portions from responding to the output of the light to electric transducer upon completion of the threshold signal determining scan of the field.

* * * * *